Figure 1:
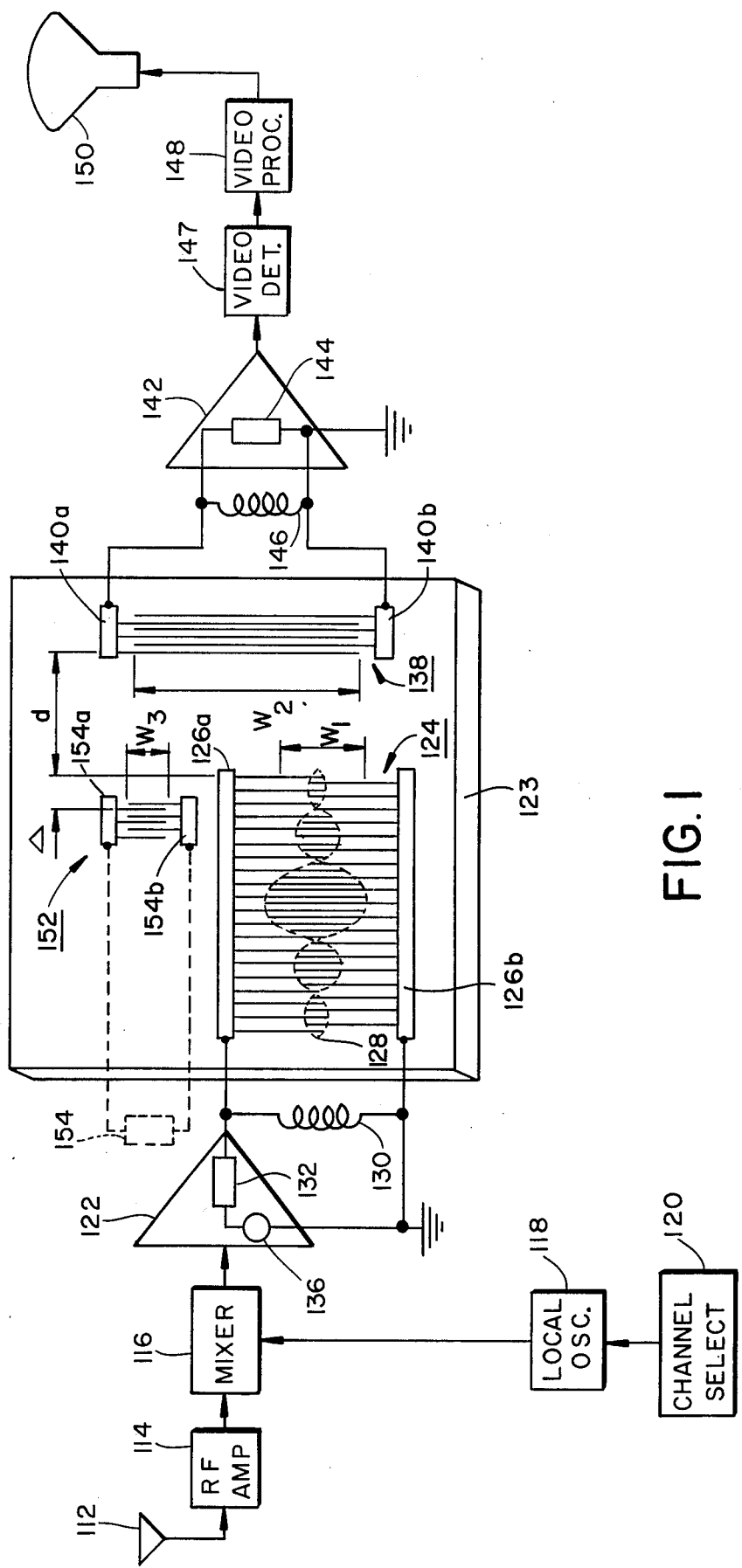

United States Patent [19]

Onyshkevych

[11] 4,060,833

[45] Nov. 29, 1977

[54] TRANSDUCER ARRANGEMENT FOR A SURFACE ACOUSTIC WAVE DEVICE TO INHIBIT THE GENERATION OF MULTIPLE REFLECTION SIGNALS

[75] Inventor: Lubomyr Stephen Onyshkevych, Lawrenceville, N.J.

[73] Assignee: RCA Corporation, New York, N.Y.

[21] Appl. No.: 680,073

[22] Filed: Apr. 26, 1976

[51] Int. Cl.$^2$ ............................................. H04N 5/48
[52] U.S. Cl. .................................. 358/188; 358/905;
333/72; 310/313; 310/366
[58] Field of Search ............... 333/72, 30 R; 310/9.8;
178/7.3 R; 358/188

[56] References Cited

U.S. PATENT DOCUMENTS

| | | | |
|---|---|---|---|
| 3,596,211 | 7/1971 | Dias et al. | 310/9.7 |
| 3,662,293 | 5/1972 | DeVries | 333/30 R |
| 3,810,257 | 5/1974 | Jones et al. | 333/72 |
| 3,908,137 | 9/1975 | Hunsinger | 333/72 |

OTHER PUBLICATIONS van Raalte, "Surface Acoustic-Wave Filter for Television Intermediate Frequencies", *RCA Engineer*, June--July 1974, vol. 70, No. 1, pp. 15-19.

*Electronics Letters*, vol. 8, No. 23, Nov. 16, 1972, pp. 553-554.

*Primary Examiner*—John C. Martin
*Attorney, Agent, or Firm*—Eugene M. Whitacre; Kenneth R. Schaefer; Peter M. Emanuel

[57] ABSTRACT

The intermediate frequency (IF) portion of a television receiver includes a surface acoustic wave (SAW) filter comprising first, second and third transducers mounted on a piezoelectric substrate. Each transducer includes at least two interdigitized comb-shaped conductors. The teeth of the comb-shaped conductors of the first transducer overlap in accordance with a predetermined envelope to define a desired IF response. The first and second transducers are connected to IF circuit portions of the receiver. The third transducer is positioned from the second transducer so that regenerated acoustic signals reflected from the first and third transducers to the second transducer are substantially 180° out of phase at a predetermined frequency. The aperture $W_3$, i.e., the overlap of the teeth of the comb-shaped elements, of the third transducer is selected with respect to the aperture $W_1$ of the first transducer and the magnitude of the impedance of the combination of the first transducer and the electrical circuit connected to it so that regenerated acoustic signals reflected from the first and third transducers are substantially equal in magnitude at the predetermined frequency. The regenerated acoustic signals reflected from the first and third transducers are received by the second transducer to develop an electrical output signal substantially free of the influence of ghost-producing multiple reflection signals. The spacing between pairs of interdigitized teeth of the third transducer may be selected so that the center frequency associated with the third transducer is the frequency of the picture carrier, the frequency at which reflected signals are most readily manifested as ghost images.

11 Claims, 6 Drawing Figures

TRANSDUCER ARRANGEMENT FOR A SURFACE ACOUSTIC WAVE DEVICE TO INHIBIT THE GENERATION OF MULTIPLE REFLECTION SIGNALS

The present invention is related to the field of surface acoustic wave (SAW) devices and is particularly related to apparatus for inhibiting the generation of multiple reflection signals in SAW devices.

The use of SAW devices in the IF portion of a television receiver is discussed in an article entitled, "Surface Acoustic-Wave Filter for Television Intermediate Frequencies", by Dr. J. A. van Raalte appearing in the June-July 1974 (Volume 70, No. 1) edition of the RCA Engineer.

SAW filters have not yet gained acceptance in the television receiver industry because of obstacles such as the generation of spurious signals by the SAW device itself. One such spurious signal arises when surface acoustic waves launched by a sending transducer are partially reflected by the receiving transducer and then are re-reflected by the sending transducer to the receiving transducer. Because this spurious signal is developed in response to acoustic signals which have traversed the distance between the sending and receiving transducer three times, it is often called the triple-transit signal. Triple-transit signals (which may have a significant amplitude compared to the amplitude of the desired signal) may be processed by a television receiver to form undesirable ghost images. Other multiple transit signals such as the fifth-order transit signal also may be developed. However, these higher order transit signals have been found to be sufficiently low in amplitude with respect to the primary triple-transit signals so as not to produce a noticeable ghost image.

A number of techniques have been described for reducing the effects of reflected signals in SAW devices (see, for example, U.S. Pat No. 3,810,257 and an article by M. F. Lewis entitled, "Triple-Transit Suppression in Surface-Acoustic-Wave Devices", appearing on page 553 of *Electronic Letters*, Vol. 8, No. 23, dated Nov. 16, 1972).

In accordance with the present invention, a transducer configuration for suppressing multiple reflections generated in SAW filters includes first, second and third transducers each having an associated complex characteristic impedance. The first and second transducers are connected respectively to first and second electrical circuits each having an associated complex impedance. The first and second transducers are separated by a predetermined distance and are positioned with respect to each other so that acoustic signals may be propagated between them. The second and third transducers are positioned with respect to each other so that acoustic signals may be propagated between them. The second and third transducers are separated by a distance equal to the predetermined distance between the first and second transducers modified by an incremental distance. The incremental distance is selected so that regenerated acoustic signals reflected from the third transducer have a phase shift, at the predetermined frequency, substantially equal to the phase shift provided to regenerated acoustic signals reflected from the first transducer due to phase shift of the complex impedance associated with the combination of the first transducer and the first electrical circuit plus or minus 180 degrees. The amount of overlap of the interdigitized teeth of the comb-shaped elements comprising the third transducer, or its aperture, is selected so that regenerated acoustic signals reflected from it have a magnitude, at the predetermined frequency, substantially equal to the magnitude of regenerated acoustic signals reflected from the first transducer due to the aperture of the first transducer and the magnitude of complex impedances associated with the combination of the first transducer and the first circuit. Because the regenerated acoustic signals reflected from the first and third transducers are substantially equal in magnitude but out of phase by 180 degrees, when they are combined by the second transducer they substantially cancel. As a result, the electrical signal developed by the SAW filter is substantially free of the influence of undesirable regenerated reflected acoustic signals.

In accordance with another feature of the present invention, the teeth of the interdigitized comb-shaped elements comprising either the first or second transducers overlap in accordance with a predetermined non-uniform envelope pattern to determine the amplitude and phase versus frequency response of the electrical circuits, such as the IF circuits of a television receiver, to which the SAW filter is coupled.

In accordance with still another feature of the present invention, the SAW filter is included in the IF portion of a television receiver and the third transducer is arranged to have a maximum amplitude at a center frequency substantially equal to the frequency of the picture carrier so that the ghost images due to regenerated reflected acoustic signals are substantially eliminated.

In the accompanying drawings:

FIG. 1 shows a transducer configuration constructed according to the present invention employed in the IF portion of a television receiver; and FIGS. 2-6 show other transducer configurations constructed in accordance with the present invention.

Similar elements appearing in different FIGURES are identified with reference numbers which differ only in the most significant digit. Furthermore, certain dimensions in different FIGURES are similar but are labelled with different letters, since they will vary in value in accordance with the particular configuration.

In FIG. 1, radio frequency (RF) signals are received by an antenna 112 and are coupled through an RF amplifier 114 to a mixer 116. Local oscillator signals, the frequency of which is controlled according to the channel selected by a viewer by means of a channel selection until 120, are coupled to mixer 116 from a local oscillator 118. Mixer 116 combines the local oscillator signals and amplified RF carriers to form intermediate frequency (IF) signals including sound, video and color carriers. The intermediate frequency signals are coupled to an intermediate frequency amplifier 122.

The output of intermediate frequency amplifier 122 is coupled to an input or sending transducer 124 deposited on a piezoelectric substrate 123 formed, for example, of lithium niobate, capable of supporting the propagation of acoustic signals along its surface in a predetermined direction. Transducer 124 includes two comb-shaped conductors 126a and 126b. The teeth or fingers of comb-shaped conductors 126a and 126b are interdigitized to form pairs of overlapping teeth. The spacing between pairs of teeth and the amount of overlap of the teeth forming each of the pairs define an envelope pattern 128. The frequency response of the transducer 124 is determined by the shape of envelope 128. The particular shape of envelope 128, having one main lobe and two symmetrical sets of side lobes of diminishing amplitude, is tailored to provide an amplitude versus frequency response suitable for processing the intermediate frequency signals of the receiver in a manner as discussed in the aformentioned van Raalte article.

Envelope 128 also determines the characteristic impedance of the transducer 124. The characteristic impedance of transducer 124 is complex, i.e., in mathematical terms the characteristic impedance of transducer 124 may be represented as a vector quantity having a magnitude and phase angle associated with it. Amplifier 122 may be thought of as comprising an equivalent voltage source 136 and an equivalent complex source impedance 132. An inductor 130, connected in shunt or in series with the output of amplifier 122, has a value selected with respect to the complex characteristic impedance of transducer 124 and the equivalent complex source impedance 132 of amplifier 122 so that electrical power is optimally coupled to transducer 124.

A receiving or output transducer 138, comprising two interdigitized conductors 140a and 140b mounted on substrate 123, is spaced a distance "d" from transducer 124 along the direction of acoustic wave propagation to receive acoustic signals generated by transducer 124. The distance "d" is selected to minimize the size of the acoustic filter on one hand and to minimize undesirable interference from bulk waves which travel along a path descending into the body of substrate 123 as a function of the distance from transducer 124 (rather than along its surface) on the other hand.

The overlap of the teeth forming each pair of teeth of receiving transducer 138 is uniform throughout the transducer. Furthermore, transducer 138 has fewer pairs of teeth than does transducer 124. As a result, transducer 138 has a wider bandwidth than transducer 124.

Receiving transducer 138 is electrically connected to an amplifier 142. Amplifier 142 presents an equivalent complex load impedance 144 to transducer 138. An inductor 146 is connected in shunt with the input of amplifier 142 to optimize the transfer of electrical energy between transducer 138 and amplifier 142.

The output of amplifier 142 is coupled to a video detector 147 which serves to develop luminance, chrominance and synchronization signals in the video frequency range from the processed intermediate frequency signals. A separate sound channel (not shown) may also be coupled to the output of amplifier 142 to develop sound signals. The luminance, chrominance and synchronization signals are coupled to a video processing unit 148 to develop signals for forming a color image on kinescope 150.

A third transducer 152 comprising two interdigitized comb-shaped conductors 154a and 154b is also fabricated on substrate 123. Transducer 152 is electrically isolated from transducers 124 and 138 and in addition is not connected to any other electrical circuit. The transducer 152 is laterally positioned in a direction perpendicular to the direction of acoustic wave propagation above transducer 124 and is spaced along the direction of acoustic wave propagation from transducer 138 by a distance equal to $d + \Delta$. Transducer 152 has a uniform envelope and relatively few pairs of teeth compared to transducer 124 so that it has a wider bandwidth than does transducer 124. As will be seen, transducer 152 serves to inhibit or suppress triple-transit signals which might otherwise manifest themselves as ghosts on kinescope 150.

In operation, electrical signals in the intermediate frequency range generated by amplifier 122 are converted by sending transducer 124 into ultrasonic acoustic signals, having an amplitude and phase versus frequency response determined by envelope 128 of transducer 138, which travel along the surface of substrate 123 to receiving transducer 138. Receiving transducer 138 converts the received acoustic signals into electrical signals, the largest portion of which is coupled to amplifier 142. A portion of the electrical signals developed by transducer 138 also regenerates acoustic signals which travel back toward sending transducer 124 along the surface of substrate 123. These regenerated reflected acoustic signals are re-reflected by transducer 124 and, when received by transducer 138, are converted into so-called triple-transit electrical signals delayed with respect to the electrical signals originally developed by transducer 138 by an amount corresponding to two additional transit times in response to the first transit of acoustic signals launched by sending transducer 124. The triple-transit signals are coupled to kinescope 150 through video detector 147 and video processing unit 148 and may manifest themselves as ghost images which are particularly discernible by a viewer. Fifth, seventh, and so on, multiple transit signals are also generated because of the reflection of acoustic signals between transducers 124 and 138. However, these reflections are relatively attenuated with respect to the triple-transit signal and are not substantially manifested by a discernible ghost image.

Transducer 152 is arranged to suppress the triple-transit signals developed because of the regenerated reflections between transducers 124 and 138. In the same manner as will be described, transducer 152 tends to inhibit the higher order transit signals. Transducer 152 receives a portion of the acoustic signals reflected from transducer 138. In response, an electrical signal is developed across comb-shaped conductors 154a and 154b causing a regenerated acoustic signal to be reflected back toward transducer 138. The acoustic signals reflected from transducer 152 are combined with the signals reflected from transducer 124 in transducer 138. The incremental distance $\Delta$ is chosen so that the acoustic signals reflected from transducers 152 and 124 are substantially out of phase by 180° at the desired frequency. Furthermore, the amount of overlap of the teeth of transducer 152, or its aperture $W_3$, is selected so that the magnitudes of the regenerated acoustic signals reflected from transducers 124 and 152 are substantially equal at the desired frequency. As a result, the electrical output signal developed by transducer 138 is substantially free from triple-transit or other multiple reflection signals.

In selecting the values of increment $\Delta$ and aperture $W_3$ it is important to consider the fact that transducer 124 in combination with the electrical circuit connected to it, i.e., the inductor 130 and source impedance 132, affects both the magnitude and phase of the regenerated acoustic signals reflected from transducer 124 because of the complex impedance associated with the combination. If the regenerated acoustic signals reflected from transducer 152 are not similarly modified in amplitude and phase, the cancellation of the triple-transit signal will not be complete.

One possible solution would be to connect an electrical load 154 (shown by dotted lines) to transducer 152 to modify the phase and amplitude of the regenerated acoustic signal reflected from transducer 152 to compensate for the modification of the amplitude and phase of the regenerated acoustic signals reflected from transducer 124 due to its complex impedance and the complex impedance associated with the electrical circuit connected to it. However, because electrical connections increase the overall cost of the SAW filter and tend to reduce its reliability, this is not a particularly desirable solution. Thus, the addition of two electrical connections required for impedance 154 would appreciably reduce the benefits sought by the use of a SAW filter.

Rather than connecting an electrical impedance to transducer 152, incremental distance Δ associated with transducer 152 is selected so that at a predetermined frequency the regenerated acoustic signals reflected from transducer 152 have a phase shift substantially equal to the phase shift of regenerated acoustic signals reflected from transducer 124 due to the complex impedance of transducer 124 itself and the electrical circuit connected to it plus or minus 180°. Furthermore, aperture $W_3$ of transducer 152 is selected so that at a predetermined frequency the magnitude of the regenerated acoustic signal reflected from transducer 152 has a magnitude substantially equal to the magnitude of regenerated acoustic signals reflected from transducer 124 due to aperture $W_1$ of transducer 124 and the complex impedances of transducer 124 itself and the electrical circuit connected to it. The mathematical expressions for selecting Δ and $W_3$ are developed below.

In the following mathematical analysis it is assumed that transducers 124, 138 and 152 have amplitude versus frequency responses whose center frequency is chosen at the frequency at which it is desired to suppress the triple-transit signal. This means that the spacing between the pairs of teeth of each is the same. As will be later seen, this assumption does not restrain the use of the transducer configuration but only simplifies the present analysis. It will also be assumed that aperture $W_2$ of transducer 138 is larger than the sum of aperture $W_1$ of transducer 124 and $W_3$ of transducer 152 so that transducer 138 is able to receive substantially all the acoustic energy transmitted by transducers 124 and 152. Because transducers 138 and 152 have uniform envelopes, apertures $W_2$ and $W_3$ are equal to the overlap of any one of the pairs of teeth of transducers 138 and 152, respectively. However, because envelope 128 of transducer 124 is non-uniform, aperture $W_1$ is not determined by the overlap of any one of the pairs of teeth of transducers 124 but rather is equal, in essence, to the integrated average of the overlaps associated with each pair of teeth comprising transducer 124. In other words, aperture $W_1$ of transducer 124 is equal to the aperture of a transducer having a uniform envelope which would produce a reflected acoustic signal having the same magnitude as an acoustic signal reflected from transducer 124. Thus, $W_1$ may be measured as well as calculated.

Receiving transducer 138 develops a voltage $V_O''$ in response to the acoustic signals arriving from transducer 124 during the first transit. Receiving transducer 138 launches an acoustic wave in response to the voltage $V_O''$ which is received by transducers 124 and 152 which in turn generate voltages $V_R'$ and $V_R'''$, respectively. The expressions for voltages $V_R'$ and $V_R'''$ are $$V_R' = \frac{W_1}{W_2} \cdot A_O' \cdot V_O'' \cdot Z' /0° \qquad (1)$$

and $$V_R''' = \frac{W_3}{W_2} \cdot A_O'' \cdot V_O'' \cdot Z''' /\frac{\theta}{2} \qquad (2)$$

where $A_O'$ and $A_O''$ are the transfer functions for the transducer pair including transducers 124 and 128 and the transducer pair including transducers 152 and 138, respectively, $Z'$ is the complex impedance associated with the combination of transducer 124 and the electrical circuit connected to it, $Z'''$ is the complex impedance associated with transducer 152 and $\theta/2$ is the phase shift due to incremental distance α at the predetermined frequency. The transfer function $A_O'$ is a scalar value which is determined by measuring the short circuit current through transducer 124 when a particular voltage is applied across transducer 138 and taking the ratio between the current and voltage. Transfer function $A_O''$ is determined in a similar manner.

Regenerated acoustic waves are launched by transducers 124 and 152 in response to voltages $V_R'$ and $V_R'''$ which are received by transducer 138 and converted into respective voltages $V_{TT}'$ and $V_{TT}'''$ given by the expressions $$V_{TT}' = \left(\frac{W_1}{W_2}\right)^2 \cdot (A_O')^2 \cdot V_O'' \cdot Z' \cdot Z'' /0° \qquad (4)$$

and $$V_{TT}''' = \left(\frac{W_3}{W_2}\right)^2 \cdot (A_O'')^2 \cdot V_O'' \cdot Z''' \cdot Z'' /\theta \qquad (5)$$

where it is assumed that the transfer function for transducer pairs are symmetrical with respect to the direction of energy transfer and where $Z''$ is the complex impedance associated with the combination of transducer 138 and the electrical circuit connected to it. To have the voltages $V_{TT}'$ and $V_{TT}'''$ cancel at the predetermined frequency, the magnitude of the complex voltage $V_{TT}'$ must equal the magnitude of the complex voltage $V_{TT}'''$ and the phase of the complex voltage $V_{TT}'$ must be 180° out of phase with the complex voltage $V_{TT}'''$. This means that $$(W_3)^2 = \frac{(W_1)^2 (A_O')^2 |Z'|}{(A_O'')^2 |Z'''|} \qquad (6)$$

and $$\theta = \phi' - \phi''' \pm 180° \qquad (7)$$

where $|Z'|$ and $|Z'''|$ are the magnitudes of complex impedances $Z'$ and $Z'''$, respectively, and $\phi'$ and $\phi'''$ are the phase angles of complex impedances $Z'$ and $Z'''$, respectively.

It is noted with respect to expressions 6 and 7 above that the impedance of the transducer which combines the voltages $V_{TT}'$ and $V_{TT}'''$, i.e., in the arrangement of FIG. 1, receiving transducer 138, does not contribute to the selections of incremental distance Δ and aperture $W_3$. However, as earlier mentioned, it is desirable that the aperture $W_2$ be greater or equal to the sum of apertures $W_1$ and $W_3$ to ensure that transducer 138 is able to receive substantially all the acoustic energy from transducers 124 and 152.

With respect to the arrangement of the SAW filter of FIG. 1, it is noted that input transducer 124 has a non-uniform or apodized envelope to shape the IF characteristics of the receiver while transducer 138 has a uniform envelope. This is so because the regenerated acoustic signals selected from a transducer are developed where the teeth of the transducer overlap and are not developed where the teeth of the transducer do not overlap. Therefore, if receiving transducer 138 rather than sending transducer 124 were to have a non-uniform envelope, it would be more difficult to select the aperture and lateral position of transducer 152.

Furthermore, it is noted that the bandwidth of a transducer having relatively few pairs of teeth is wider than the bandwidth of a transducer having relatively many pairs of teeth. Therefore, both reflecting transducers 152 and receiving transducer 138 are arranged to have relatively few pairs of teeth so that multiple transit signals will be suppressed over a relatively wider range of frequencies than if transducers 152 and 138 had more pairs of teeth. However, even with a relatively few number of pairs of teeth, transducers 152 and 138 have an amplitude versus frequency response which is of a rather limited bandwidth. Therefore, the suppression of triple-transit and other multiple reflection signals is most effective at a predetermined frequency determined by the selection of $\Delta$ and $W_3$. Since triple-transit signals manifest themselves most undesirably as ghost images, it is desirable to suppress the triple-transit signals at and near to the picture carrier (e.g., 45.75 MHz). Therefore, the spacing of the pairs of teeth of transducer 152 should be selected to provide a center frequency at the picture carrier. However, so that the IF response is properly maintained, the sending and receiving transducers should desirably have pairs of teeth spaced to provide a center frequency at the midrange of the desired IF amplitude versus frequency response.

Figure 2:
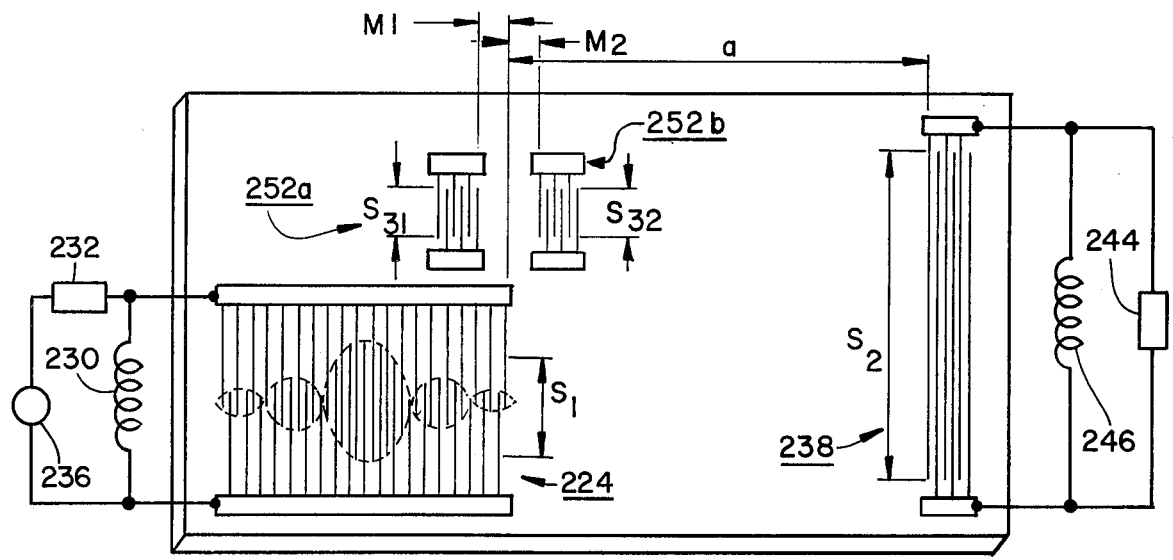

In FIG. 2, single reflecting transducer 152 is replaced by two reflecting transducers 252a and 252b laterally spaced in a direction perpendicular to the direction of acoustic wave propagation above a sending transducer 224 and offset from the distance "a" between sending transducer 224 and receiving transducer 238 by incremental distances $M_1$ and $M_2$, respectively. Incremental distances $M_1$ and $M_2$ and apertures $S_{31}$ and $S_{32}$ of transducers 252a l and 252b, respectively, are selected so that, at a predetermined frequency, reflecting transducer 252a generates a reflected acoustic signal in response to the regenerated acoustic signal reflected from receiving transducer 238 which is out of phase with the regenerated acoustic signal reflected from sending transducer 224 by $+180°$ and has a magnitude equal to a first portion of the magnitude of the regenerated acoustic signal reflected from sending transducer 224. Furthermore, reflecting transducer 252b generates a reflected acoustic signal in response to the regenerated acoustic signal reflected from receiving transducer 238 which is out of phase with the regenerated acoustic signal reflected from sending transducer 224 by $-180°$ and has a magnitude equal to a second portion of the magnitude of the regenerated acoustic signal reflected from sending transducer 224. The first and second portions are selected to have a sum substantially equal to the magnitude of the regenerated acoustic signal reflected from sending transducer 224 at the predetermined frequency. At a frequency other than the predetermined frequency, the acoustic signals reflected from transducers 252a and 252b will not be $+180°$ and $-180°$, respectively, out of phase with the regenerated acoustic signal reflected from receiving transducer 238 but will vectorially add to produce a signal which will be substantially 180 degrees out of phase with the regenerated acoustic signal reflected from receiving transducer 238. As a result, the combined effect of the transducer configuration of FIG. 2 will be to suppress multiple reflection signals over a relatively wider bandwidth than does the configuration of FIG. 1. Theoretically, the configuration of FIG. 2 will provide a 40 db (decibel) suppression of triple-transit signals over approximately a 9 percent deviation from the predetermined frequency at which it is desired to suppress triple-transit signals while the configuration of FIG. 1 will provide a 40 db suppression of triple-transit signals only over a 1 percent deviation from the predetermined frequency.

The mathematical expressions for selecting $S_{31}$, $S_{32}$, $M_1$ and $M_2$, developed in a manner similar to the manner in which expressions 6 and 7 were developed are $$(S_{31})^2 = (S_{32})^2 = \frac{1}{2} \frac{(S_1)^2 (K_O')^2 |X'|}{(K_O'')^2 |X'''|} \tag{8}$$

and $$\gamma_1 = \rho' - \rho''' - 180° \tag{9}$$

and $$\gamma_2 = \rho' - \rho''' + 180° \tag{10}$$

where:
$S_{31}$ and $S_{32}$ are selected to be equal;
it is assumed that the complex characteristic impedances of transducers 252a and 252b are both equal to $X'''$;
$X'$ is the complex impedance associated with the combination of transducer 224 and the electrical circuit connected to it;
$K_O'$ is the transfer function associated with the transducer pair including transducers 224 and 238;
it is assumed that each transfer function associated with the transducer pair including transducers 238 and 252a and the transducer pair including transducers 238 and 254 is equal to $K_O''$;
$\gamma_1$ is the phase angle attributable to $M_1$;
$\gamma_2$ is the phase angle attributable to $M_2$; and
$\rho'$ and $\rho'''$ are the phase angles of the complex impedances $X'$ and $X'''$, respectively.

Figure 3:
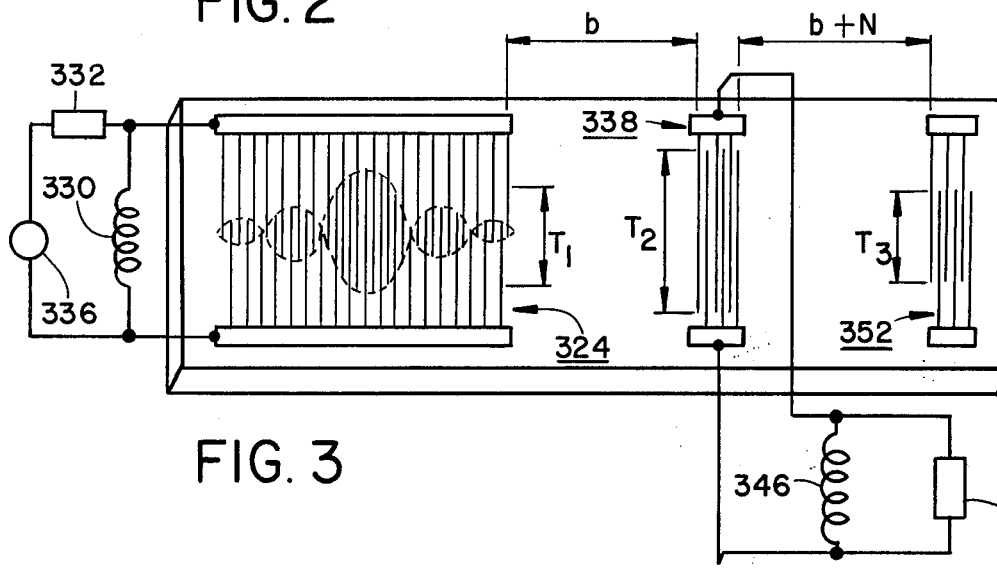

In the transducer configuration of FIG. 3, a receiving transducer 338 is located between a sending transducer 234 and a reflecting transducer 352 at a distance "b" from sending transducer 324 and a distance "b" plus incremental distance N from reflecting transducer 352. In this configuration, acoustic signals launched by sending tranducer 324 are converted to electrical signals by receiving transducer 338. Acoustic signals are regenerated by receiving transducer 338 and launched in opposite direction to sending transducer 324 and reflecting transducer 352. The incremental distance N and aperture $T_3$ are selected so that reflecting transducer 352 generates a reflected acoustic wave substantially equal in magnitude but opposite in phase with the regenerated acoustic signal reflected from sending transducer 324. The acoustic signals reflected from transducers 324 and 352 are summed in receiving transducer 338 and substantially cancel each other so that the electrical signals developed by receiving transducer 338 are substantially free of triple-transit signals.

Expressions for incremental distance N and aperture T₃ may be developed in a manner similar to the manner in which the expressions for the corresponding dimensions of the configurations of FIGS. 1 and 2 were developed. However, in the configuration of FIG. 3, consideration should be given to the fact that some of the acoustic signals generated by sending transducer 324 are fed through receiving transducer 338 and reach reflecting transducer 352.

Figure 4:
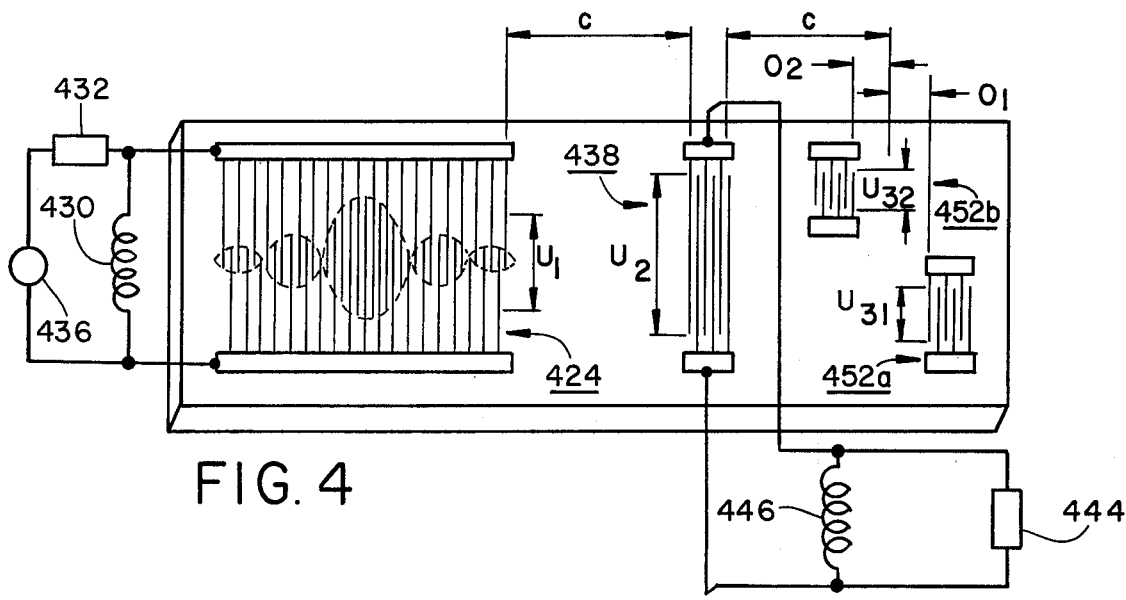

The transducer configuration of FIG. 4 is a modification to the configuration of FIG. 3 wherein two reflecting transducers 452a and 452b are utilized in the place of reflector 352 of FIG. 3 to broaden the bandwidth over which the triple-transit signal may be suppressed.

Figure 5:
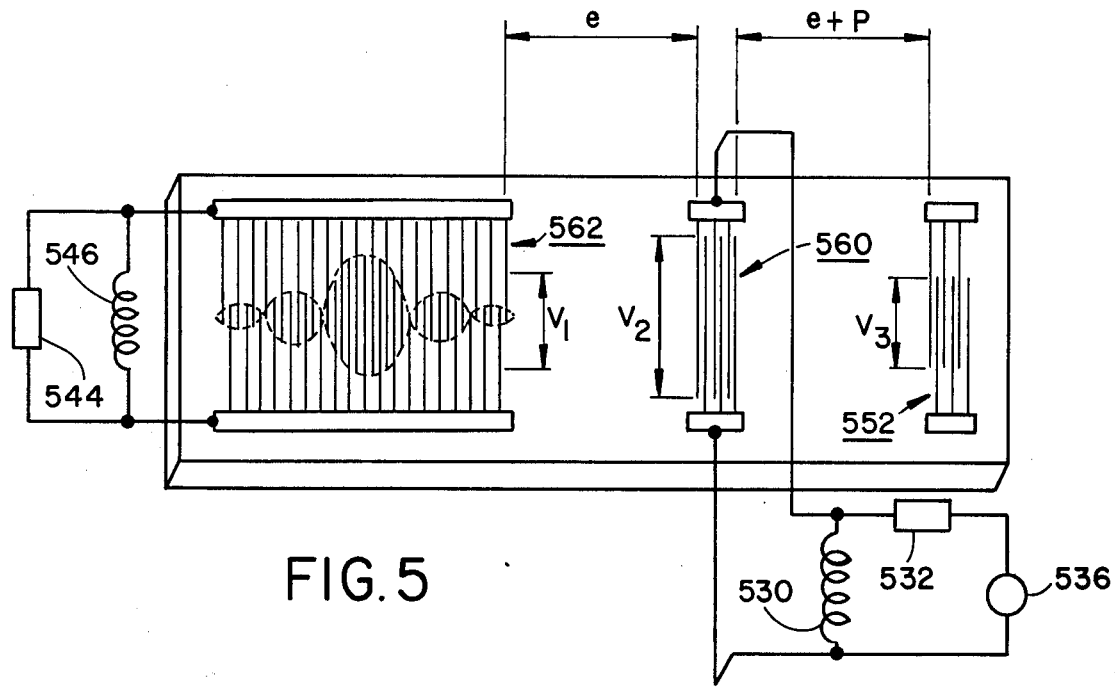

In the transducer configuration of FIG. 5, a sending transducer 560 is located between a receiving transducer 562 and a reflecting transducer 552 by distances "e" and "e" plus incremental distance P, respectively. In this case, the regenerated reflected acoustic signals developed by receiving transducer 562 and the reflecting transducer 552 are summed by sending transducer 560, rather than by the receiving transducer, as in the configurations of FIGS. 1-4, to suppress triple-transit signals. Furthermore, since here the sending transducer 560 sums the acoustic signals reflected from receiving transducer 562 and reflecting transducer 552, it is desirable that receiving transducer 562 rather than sending transducer 560 have a non-uniform envelope to define the receiver's IF amplitude versus frequency response.

Figure 6:
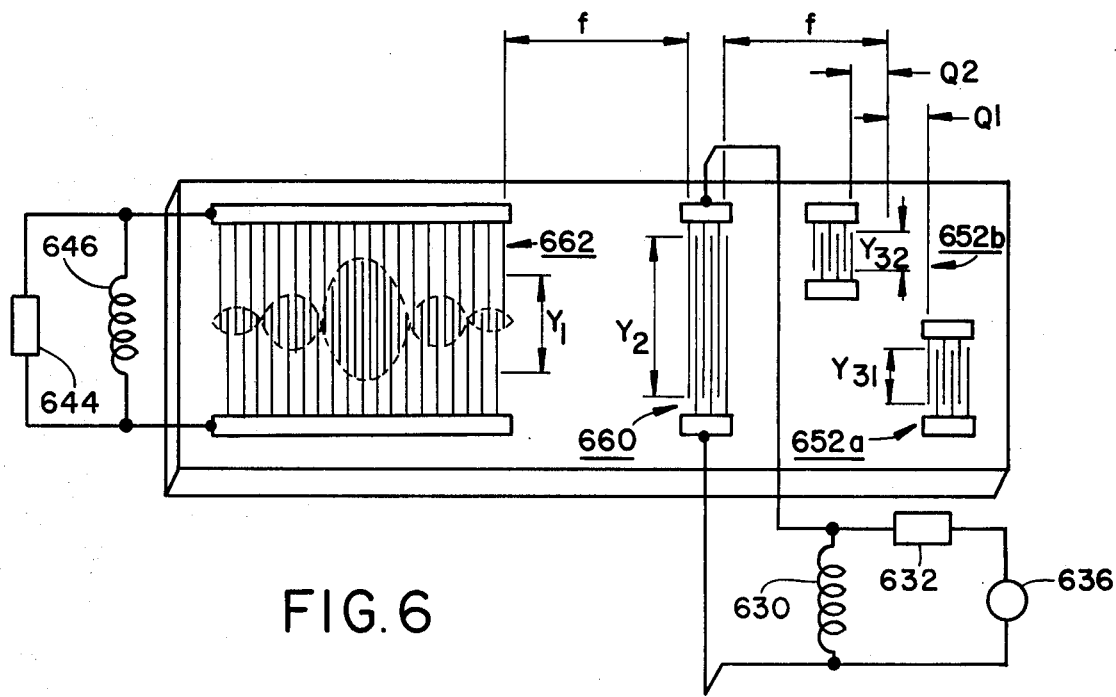

The configuration of FIG. 6 is a modification to the configuration of FIG. 5 wherein reflecting transducer 552 of FIG. 5 is replaced by two transducers 652a and 652b to increase the bandwidth over which the triple-transit signal will be reduced.

Although in the descriptions of the transducer configurations the summing transducer which combines the reflected signals from the other transducers to suppress multiple transit signals (i.e., the transducers have an aperture with 2 as a subscript) has been arranged to have a uniform or unapodized envelope, it may be arranged to have a non-uniform or apodized envelope to define a particular frequency response although the analysis of this configuration is somewhat more complex. Furthermore, the present inventions have been described in terms of transducer configurations wherein the teeth of the transducers have been shown as a single conductive strip for the sake of clarity, it will be appreciated that the teeth may be split into two strips separated by a distance corresponding, for example, to a quarter of a wavelength so as to suppress reflections from the teeth themselves as was earlier described. These and other modifications are considered to be within the scope of the present invention.

What is claimed is:

1. Apparatus comprising:
    a piezoelectric substrate capable of supporting acoustic signals;
    first, second and third transducers associated with one surface of said substrate, each of said transducers including at least one pair of interdigitized comb-shaped conductors, each of said transducers having a complex characteristic impedance associated therewith;
    first and second electrical circuits respectively connected between said comb-shaped conductors of said first and second transducers, each of said circuits having a complex impedance associated therewith;
    said first and second transducers being space apart a predetermined distance and aligned with respect to one another so that acoustic signals may be propagated between them;
    said third transducer having no electrical connections thereto;
    said third transducer being space apart from said second transducer by said predetermined distance modified by an incremental distance and aligned with respect to said second transducer so that acoustic signals may be propagated between them, said incremental distance being selected with respect to the phase shift provided by said complex characteristic impedance of said first transducer and said complex impedance of said first circuit so that the acoustic signals reflected from said third transducer are substantially out of phase with acoustic signals reflected from said first transducer at a predetermined frequency;
    said third transducer having an aperture selected with respect to the aperture of said first transducer and the magnitudes of said complex characteristic impedance of said first transducer and said complex impedance of said first circuit so that the magnitude of acoustic signals reflected from said third transducer is substantially the same as the magnitude of acoustic signals reflected from said first transducer at said predetermined frequency; and
    said second transducer receiving and substantially cancelling reflected acoustic waves from said first transducer and said third transducer.

2. The apparatus recited in claim 1 wherein the teeth of the interdigitized comb-shaped conductors of said first transducer overlap to define a non-uniform envelope; and the teeth of the interdigitized comb-shaped conductors of said second transducer overlap to define a uniform envelope.

3. The apparatus recited in claim 2 wherein said first and second circuits comprise portions of an intermediate frequency signal processing unit of a television receiver for processing intermediate frequency signals including a picture carrier; said non-uniform envelope of said first transducer determines the amplitude versus frequency response of said intermediate frequency processing unit having a center frequency offset from the frequency of said picture carrier; and said predetermined frequency is selected substantially equal to the frequency of said picture carrier.

4. The apparatus recited in claim 3 wherein said third transducer has a uniform envelope associated therewith.

5. The apparatus recited in claim 4 wherein said third transducer comprises two pairs of interdigitized comb-shaped conductors spaced laterally with respect to the direction of the acoustic path between said first and second transducers, said pairs of transducers being offset in the direction of the acoustic path between said first and second transducers by incremental distances in both directions with respect to said predetermined distance.

6. The apparatus recited in claim 4 wherein said third transducer is laterally positioned with respect to said first transducer and the second transducer has an aperture greater than the combined apertures of said first and third transducers.

7. The apparatus recited in claim 6 wherein said first transducer is connected to a source of electrical signals and wherein said second transducer is connected to an electrical load.

8. The apparatus recited in claim 4 wherein said third transducer is positioned along the direction of the acoustic path between said first and second transducers.

9. The apparatus recited in claim 8 wherein said second transducer is positioned between said first transducer and said third transducer.

10. The apparatus recited in claim 9 wherein a source of electrical signals is connected to said first transducer and an electrical load is connected to said second transducer.

11. The apparatus recited in claim 9 wherein a source of electrical signals is connected to said second transducer and an electrical load is connected to said first transducer.

* * * * *